(12) United States Patent
Abe et al.

(10) Patent No.: US 7,176,756 B2
(45) Date of Patent: Feb. 13, 2007

(54) INDUCTOR ELEMENT CONTAINING CIRCUIT BOARD AND POWER AMPLIFIER MODULE

(75) Inventors: Toshiyuki Abe, Tokyo (JP); Yoshihiro Suzuki, Tokyo (JP); Masashi Katsumata, Tokyo (JP)

(73) Assignee: TDK Corporation, Tokyo (JP)

( * ) Notice: Subject to any disclaimer, the term of this patent is extended or adjusted under 35 U.S.C. 154(b) by 97 days.

(21) Appl. No.: 11/010,327

(22) Filed: Dec. 14, 2004

(65) Prior Publication Data

US 2005/0140434 A1 Jun. 30, 2005

(30) Foreign Application Priority Data

Dec. 26, 2003 (JP) ............................. 2003-432616
Mar. 23, 2004 (JP) ............................. 2004-085302

(51) Int. Cl.
*H03F 1/00* (2006.01)
*H05K 1/00* (2006.01)

(52) U.S. Cl. ......................................... 330/66; 361/748
(58) Field of Classification Search ................. 330/66; 361/748

See application file for complete search history.

(56) References Cited

U.S. PATENT DOCUMENTS 6,992,366 B2 * 1/2006 Kim et al. ................... 257/531

2003/0202331 A1 * 10/2003 Jessie et al. ................ 361/764

FOREIGN PATENT DOCUMENTS

| JP | 6-224539 | 8/1994 |
|---|---|---|
| JP | 8-172161 | 7/1996 |
| JP | 10-270248 | 10/1998 |
| JP | 2001-345661 | 12/2001 |
| JP | 2002-15917 | 1/2002 |
| JP | 2002-141757 | 5/2002 |

* cited by examiner

*Primary Examiner*—Robert Pascal
*Assistant Examiner*—Krista M. Flanagan
(74) *Attorney, Agent, or Firm*—Oblon, Spivak, McClelland, Maier & Neustadt, P.C.

(57) ABSTRACT

An inductor element containing circuit board of the present invention comprises a plurality of conductive layers, and a conductor having an inductor function (inductor conductor segment) in one or more of the conductive layers, wherein at least part of the inductor conductor segment is made thicker than other conductors disposed within the circuit board. The at least part of the inductor conductor segment extends through an insulating layer disposed between the conductive layers, or is embedded in the insulating layer, wherein the part of the inductor conductor segment has a thickness one-half or more the thickness of the insulating layer. A power amplifier module of the present invention comprises the multi-layer circuit board, a semiconductor amplifier fabricated in the multi-layer circuit board, and an impedance matching circuit coupled to the output of the semiconductor amplifier. The impedance matching circuit has a portion thereof formed of the inductor conductor segment.

8 Claims, 16 Drawing Sheets

INDUCTOR ELEMENT CONTAINING CIRCUIT BOARD AND POWER AMPLIFIER MODULE

BACKGROUND OF THE INVENTION

The present invention relates to an inductor element containing circuit board and a power amplifier module, and more particularly, to a circuit board structure which has an inductor element contained in a multi-layer circuit board.

In recent years, the proliferation of communication terminal devices represented by mobile telephones has resulted in an increased demand for power amplifier modules for use in transmitters in the micro-wave band. Such a power amplifier module is disposed in front of an antenna, for example, in a mobile telephone for performing a function of amplifying a signal outputted from a driver amplifier and delivering the amplified signal to the antenna, and generally comprises a three-stage amplifier circuit, an output matching unit, a second harmonic compensator, and the like.

Each stage of the amplifier circuit includes a semiconductor amplifier device such as FET, a matching circuit, a drain bias circuit, a gate bias circuit, and the like to form a complete circuit block. The output matching unit in turn is a circuit for matching the impedance in a frequency band intended for amplification (basic wave). in a frequency band used by the power amplifier module (for example, 880–915 MHz). The second harmonic compensator serves to prevent a second harmonic component from being delivered to the output because a frequency other than the basic wave delivered to the output can cause degraded characteristics of an associated communication terminal device.

For implementing a power amplifier module having the circuit configuration as described above, a laminate dielectric circuit board, for example, is used to form a matching circuit, a second harmonic compensator, part of an FET bias circuit (resistor, capacitor), a ($\lambda$/4) pattern of a bias circuit, and the like distributively in layers of the circuit board. Some of other resistors and capacitors are mounted on the circuit board using surface-mount type elements. Inductor elements are formed as conductor patterns on the layers of the circuit board. Semiconductor amplifier devices such as FET are directly mounted on the circuit board in the form of bare chip, or packaged in resin moldings for mounting on the circuit board.

JP-A-8-172161 and JP-A-2002-141757 disclose such a circuit board structure which comprises a power amplifier module or inductor elements.

SUMMARY OF THE INVENTION

Communication terminal devices, particularly mobile telephones, have been rapidly reduced in size in recent years, leading to a heavy demand for a like reduction in size of the power amplifier module which is a component of such devices.

However, a reduction in size of a power amplifier module necessarily involves a reduction in width of conductor lines of elements contained in a circuit board, giving rise to an associated problem of an increased loss in each element. Particularly, a loss in an inductor element in the circuit board results in a lower efficiency of the power amplifier module, and a loss in an output matching unit, which entails large output power, constitutes a major cause for degrading the characteristics of the power amplifier module.

For preventing such losses, it is contemplated to simply increase the thickness of a conductor pattern which forms each element within a circuit board. However, when the thickness of a conductor is increased using a thicker copper foil, variations in pattern width increases in an etching step for forming conductor patterns. Consequently, variations in the width of each pattern result in larger variations in inductance and capacitance. Alternatively, when plating is employed to provide thicker conductors, the resulting conductors largely vary in thickness, causing larger variations in thickness of dielectric layers in a step of adhering a resin-coated copper foil to form the dielectric layers. This results in larger variations in capacitance. As appreciated from the foregoing, an increase in thickness of conductors within the overall circuit board disadvantageously results in larger variations in respective element values. In addition, the circuit board is more susceptible to bowing and deformation, possibly reducing the yield rate of products. Moreover, since an increased thickness of conductors causes an increase in the amount of conductors occupied in the circuit board, the circuit board becomes heavier.

The invention described in the aforementioned JP-A-8-172161 aims at reducing a loss of inductor elements. However, this patent document, though disclosing means for reducing a parasitic capacitance, does not show any specific means for reducing the resistance of inductor elements. On the other hand, the invention described in the aforementioned JP-A-2002-141757 is intended to reduce the size of a power amplifier module, but attempts to achieve the object mainly from the viewpoint of component materials of the circuit board.

A problem to be solved by the present invention is therefore an increased loss of a conductor having a function of inductor resulting from a reduction in size of a circuit board or a module, so that it is an object of the present invention to reduce such a loss.

To solve the above problem, a multi-layer circuit board containing an inductor element according to the present invention includes a plurality of conductive layers, and a conductor having an inductor function formed in at least one of the plurality of conductive layers, wherein the conductor having an inductor function has a larger thickness in at least part thereof than conductors formed on an insulating layer within the multi-layer circuit board.

In the present invention, conductors within the circuit board are not uniformly made thick, but part of the conductor having an inductor function (hereinafter called the "inductor conductor segment") is only made thicker for purposes of reducing a loss. In this way, a loss in the inductor conductor segment can be reduced while suppressing variations in inductance and capacitance of elements within the circuit board, preventing the circuit board from bowing or deforming during a manufacturing process, and minimizing an increase in the weight of the circuit board.

A specific feature for increasing the thickness of the inductor conductor segment may include at least part of the inductor conductor segment which extends through an insulating layer disposed between the conductive layers. Alternatively, at least part of the inductor conductor segment may be embedded in an insulating layer disposed between the conductive layers, and have a thickness one-half or more the thickness of the insulating layer to an extent that the at least part of the conductor doest not extend through the insulating layer. Further alternatively, at least part of the inductor conductor segment may be embedded in an insulating layer disposed between the conductive layers, and has a thickness 1.5 times or more larger than the conductors other than the conductor having an inductor function. The loss can be reduced by thus increasing the thickness of the inductor conductor segment.

A first power amplifier module according to the present invention includes a semiconductor amplifier, an impedance matching circuit coupled to an output of the semiconductor amplifier, and the inductor element containing circuit board according to the present invention, wherein the impedance matching circuit partially includes the conductor having an inductor function.

A second power amplifier module according to the present invention includes a semiconductor amplifier, a bias circuit connected to the semiconductor amplifier, and the inductor element containing circuit board according to the present invention, wherein the bias circuit partially includes the conductor having an inductor function.

A third power amplifier module according to the present invention includes a semiconductor amplifier, an impedance matching circuit coupled to an output of the semiconductor amplifier, a bias circuit connected to the semiconductor amplifier, and the inductor element containing circuit board according to the present invention, wherein the impedance matching circuit and bias circuit partially include the conductor having an inductor function.

When a power amplifier module is reduced in size, a loss in an inductor element disposed within a circuit board will reduce the efficiency of the power amplifier module, and particularly, a loss in an output matching unit, which entails large output power, constitutes a major cause for degrading the characteristics of the power amplifier module. In the first to third power amplifier modules of the present invention, one or both of the impedance matching circuit and bias circuit have portions formed of the inductor conductor segment, i.e., the conductor, the thickness of which is increased, to reduce a loss in the inductor conductor segment and prevent degraded characteristics of the power amplifier module.

A method of manufacturing a multi-layer circuit board containing an inductor element, according to the present invention, includes the steps of forming a conductor pattern on one of layers in the multi-layer circuit board, and increasing the thickness of at least part of the conductor pattern by plating, such that the part of the conductor having an inductor function has a thickness larger than other conductors in the circuit board.

The foregoing method according to the present invention can suppress variations in inductance and capacitance of elements within the circuit board, as well as prevent the circuit board from bowing or deforming during a manufacturing process, minimize an increase in the weight of the circuit board, and reduce a loss in the conductor having an inductor function.

DESCRIPTION OF THE PREFERRED EMBODIMENTS

In the following, several embodiments of the present invention will be described with reference to the accompanying drawings.

[First Embodiment]

Figure 1:
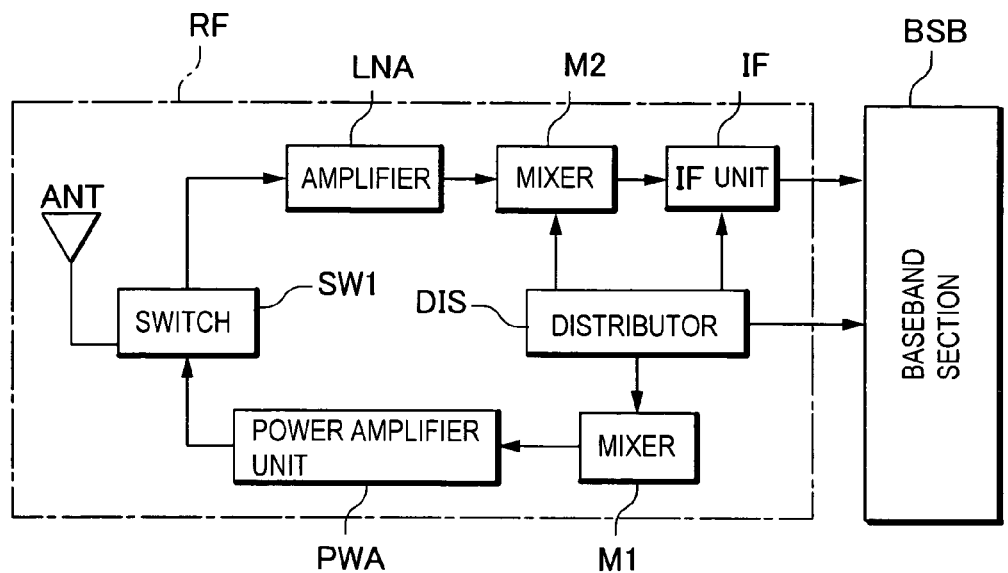
FIG. 1 is a block diagram illustrating an exemplary RF section in a mobile telephone.
Figure 2:
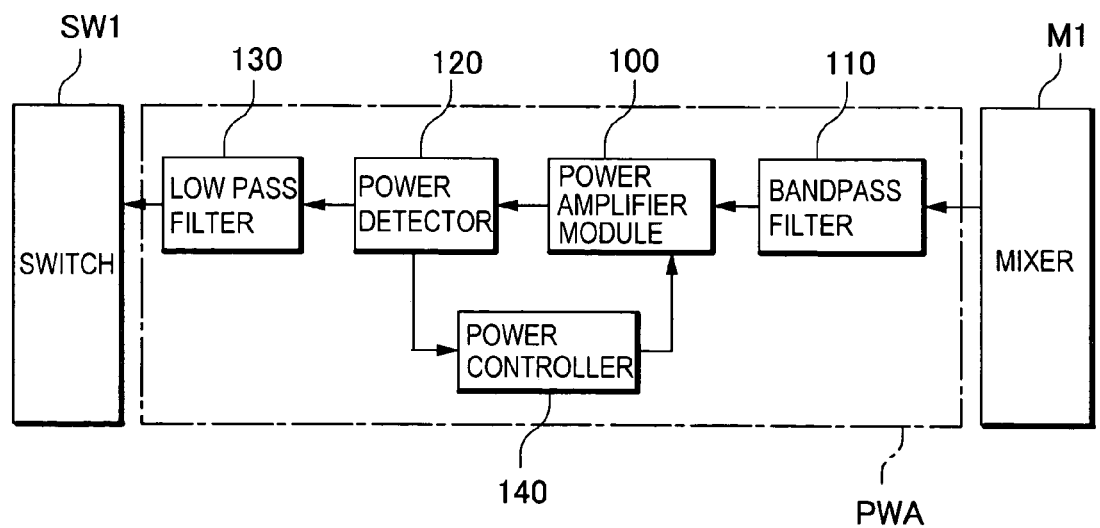
FIG. 2 is a block diagram illustrating an exemplary configuration of a power amplifier unit included in the RF section (high frequency section) of FIG. 1.
Figure 3:
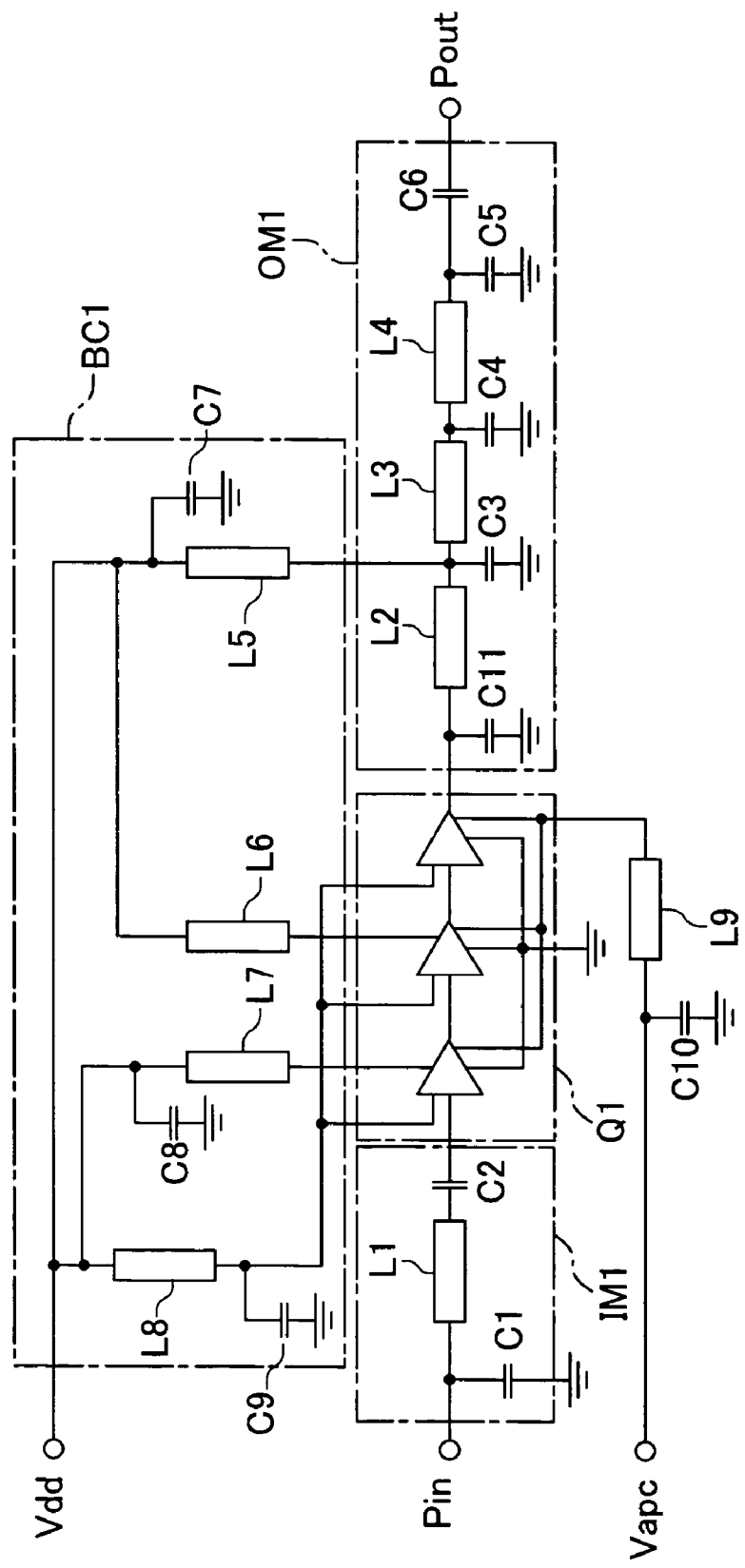
FIG. 3 is a circuit diagram illustrating an exemplary configuration of a power amplifier module included in the power amplifier unit of FIG. 2.

FIG. 1 illustrates an exemplary configuration of a high frequency section in a mobile telephone which is one kind of communication terminal devices; FIG. 2 illustrates a power amplifier unit included in the high frequency section; and FIG. 3 illustrates a power amplifier module included in the power amplifier unit.

As illustrated in FIG. 1, the high frequency section RF (RF section) comprises a power amplifier unit PWA and a mixer M1 along a transmission path, and an amplifier LNA and a mixer M2 along a reception path, respectively, and further comprises an antenna ANT, a switch SW1, a distributor DIS, and an intermediate frequency unit IF (IF unit).

The power amplifier unit PWA is disposed in front of the antenna ANT on the transmission path of the RF section for delivering an amplified signal to the antenna ANT through the switch SW1. The mixer M1 is disposed in front of the power amplifier PWA for mixing a signal supplied from a modulator (not shown) with a signal supplied from the distributor DIS to supply the output of the mixer M1 to the power amplifier unit PWA.

On the other hand, a signal received by the antenna ANT and led to the reception path by changing over the switch SW1 is amplified by the amplifier LNA which extracts a particular frequency component from which noise has been removed. The received signal outputted from the amplifier LNA is mixed with a signal supplied from the distributor DIS in the mixer M2. The output of the mixer M2 is supplied to the IF unit, and further sent to a baseband section BSB.

A frequency band used in the power amplifier unit PWA is, for example, in a range of 880 to 915 MHz or 1710 to 1785 MHz. The output required for the power amplifier unit PWA is, for example, 35 dBm or 32 dBm.

As illustrated in FIG. 2, the power amplifier unit PWA comprises a bandpass filter (BPF) 110 in front of a power amplifier module 100, and a power detector 120 and a low pass filter (LPF) 130 connected in sequence, subsequent to the power amplifier module 100. A power controller 140 controls the power of a transmission signal outputted from the power amplifier module 100 based on a power detection signal supplied from the power detector 120. It should be noted that while this embodiment shows a circuit configuration having one power amplifier unit PWA, the present invention can also be applied, for example, to a power amplifier which supports a GSM/DCS dual band, as is known in the art.

As illustrated in FIG. 3, the power amplifier module 100 included in the power amplifier unit PWA comprises a semiconductor circuit Q1 which has three semiconductor devices connected in series; an input matching circuit IM1 connected in front of the semiconductor circuit Q1; an output matching circuit OM1 connected subsequent to the semiconductor circuit Q1; and a bias circuit BC1. In FIG. 3, a terminal Vapc is provided for controlling the output of the power amplifier module 100 which is therefore controlled by a voltage level applied to the terminal Vapc. The terminal Vapc is applied with a voltage which is a signal generated by the power detector 120 shown in FIG. 2 and fed back to the power controller 140, and the power amplifier module 100 operates in response to the Vapc signal outputted from the power controller 140 to generate a constant output.

The semiconductor circuit Q1 serves to amplify a signal applied from an input terminal Pin. The input matching circuit IM1 serves to match an impedance (50 Ω) at the input terminal Pin with an input impedance of the semiconductor circuit Q1, such that a signal applied from the input terminal Pin is delivered to the input of the semiconductor circuit Q1 without a loss due to an unmatched impedance.

The output matching circuit OM1 in turn serves to match an output impedance of the semiconductor circuit Q1 with an impedance (50 Ω) viewed at an output terminal Pout, such that a signal outputted from the semiconductor circuit Q1 is delivered to the output terminal Pout without a loss due to un unmatched impedance. The bias circuit BC1 operates the semiconductor devices included in the semiconductor circuit Q1 as amplifier devices.

Specifically, the input matching circuit IM1 may be composed of an inductor element L1 and a capacitor element C1 connected in an L-shape, and another capacitor element C2.

On the other hand, the output matching circuit OM1 comprises an L-shaped circuit composed of an inductor element L2 and a capacitor element C3 at a first stage; an L-shaped circuit composed of an inductor element L3 and a capacitor element C4 at a second stage; and an L-shaped circuit composed of an inductor element L4 and a capacitor element C5 at a third stage. The output matching circuit OM1 has an input terminal connected to a capacitor element C11, and an output terminal connected to a capacitor element C6.

Inductor elements L5–L8 in the bias circuit BC1 are required to ideally increase the impedance to infinity in order to prevent a signal amplified by the semiconductor circuit Q1 from leaking to a Vdd terminal. Therefore, these inductor elements L5–L8 are each implemented by a ($\lambda/4$) length pattern or an inductor element which has an impedance corresponding to the ($\lambda/4$) length pattern. Alternatively, the inductor elements L5–L8 can be implemented by a conductor pattern which is formed across several wiring layers in a coil shape. The inductor elements L5, L7, L8 are connected to ground capacitor elements C7, C8, C9, respectively.

Figure 4:
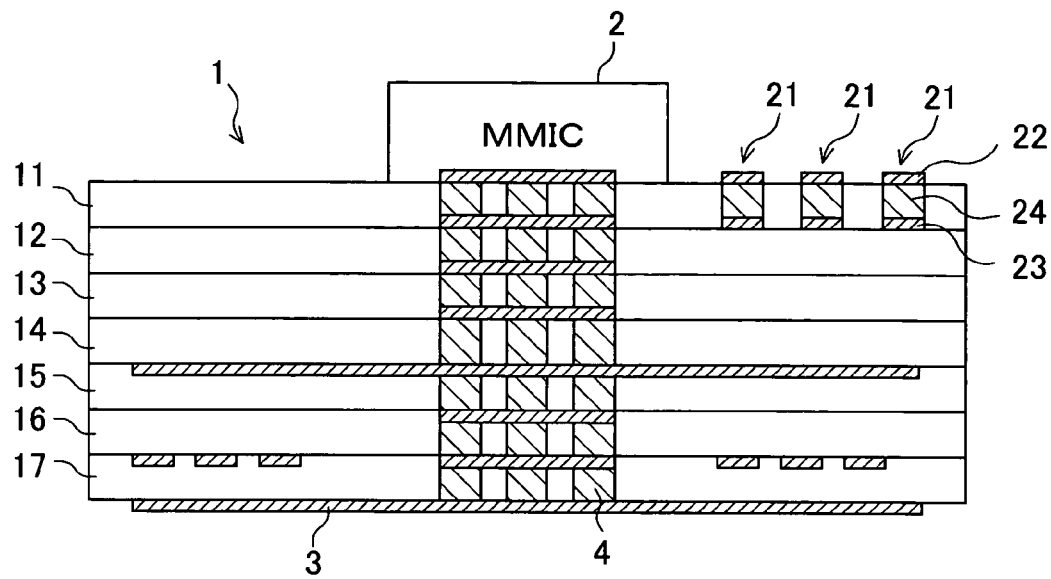
FIG. 4 is a cross-sectional view illustrating a power amplifier module according to a first embodiment of the present invention.

FIG. 4 is a cross-sectional view illustrating a power amplifier module according to a first embodiment which can be used as the power amplifier module 100 illustrated in FIG. 3. It should be noted that FIG. 4 excludes details such as wiring patterns routed within the circuit board and on the top surface of the circuit board, inter-layer connection structures, mounted parts, and the like. FIGS. 5 to 13 illustrate respective wiring layers of the power amplifier module illustrated in FIG. 4.

The power amplifier module according to this embodiment comprises a multi-layer circuit board 1 having eight conductive layers and insulating layers 11–17 interposed between the respective conductive layers; an MMIC (Microwave Monolithic IC) 2 mounted on the surface of the multi-layer circuit board 1; and a variety of elements, which make up the input matching circuit IM1, output matching circuit OM1, and bias circuit BC1, on the surface of or within the circuit board 1. Also, a ground pattern 3 is formed on the bottom surface of the circuit board 1, and thermal vias 4 are extended through the circuit board 1 below the MMIC 2 for connection to the ground pattern 3. It should be understood that the number of layers laminated in the circuit board (conductive layers), routing of each wiring pattern, and the like are not limited to the shown example, but can be modified in a various manner.

The multi-layer circuit board 1 has a laminate structure comprised of a first insulating layer 11, a second insulating layer 12, a third insulating layer 13, a fourth insulating layer 14, a fifth insulating layer 15, a sixth insulating layer 16, and a seventh insulating layer 17 laminated in this order, when viewed from above (from the top surface of the board 1), and has conductor patterns on the top surfaces or bottom surfaces of these insulating layers. The multi-layer circuit board 1 can be formed, for example, by sequentially laminating insulating sheets (for example, resin-coated copper foil) on both sides of the core substrate 14 while pressurizing and heating the materials.

Figure 10:
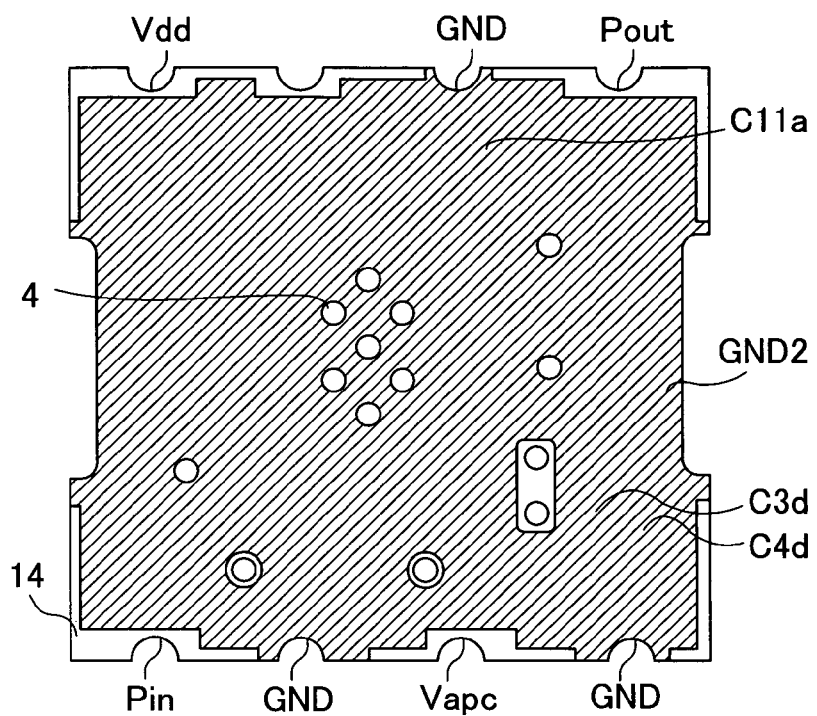
Figure 11:
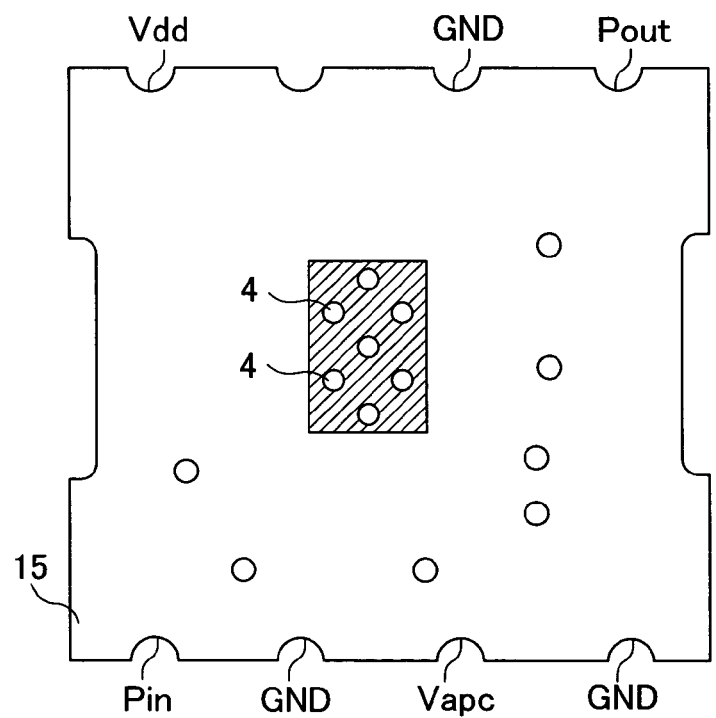
Figure 12:
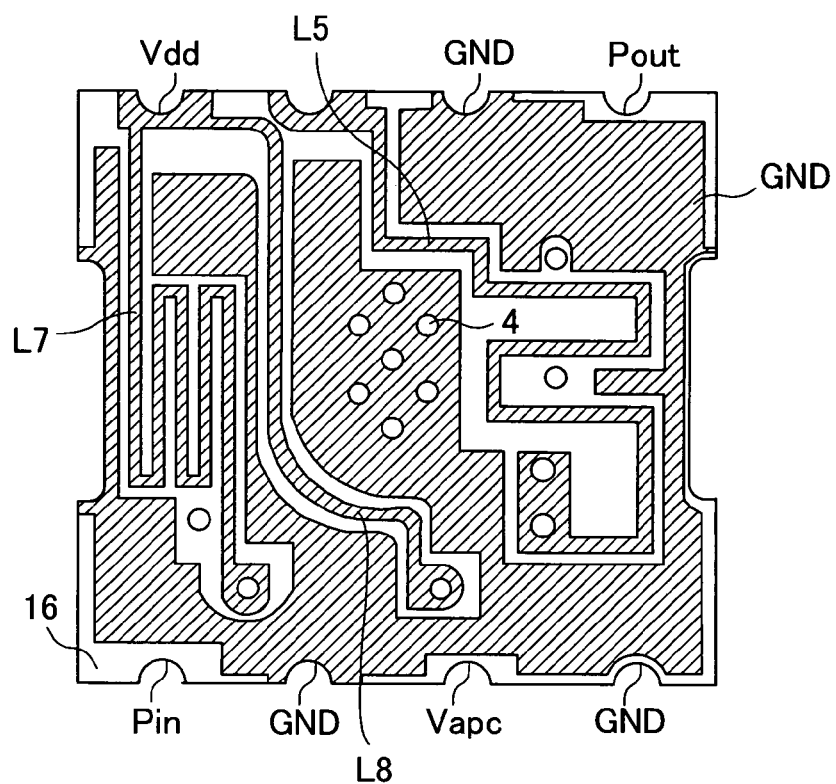
Figure 13:
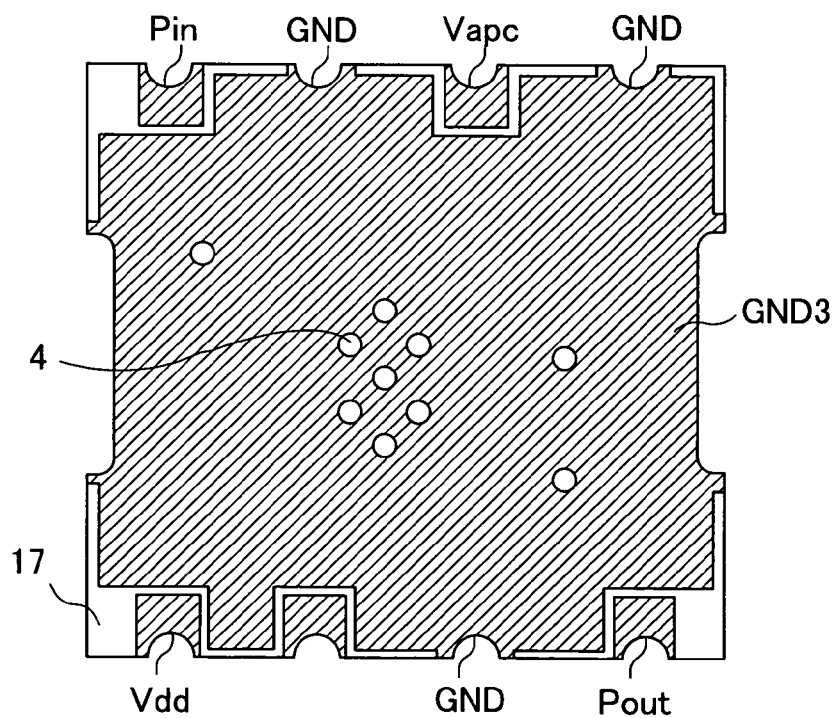

In the following description, the respective top surfaces of the first to fourth insulating layers 11–14 are called the first layer, second layer, third layer, and fourth layer, respectively, and the respective bottom surfaces of the fourth to seventh insulating layers 14–17 are called the fifth layer, sixth layer, seventh layer, and eighth layer, respectively. Specifically, the top surface (front) of the multi-layer circuit board 1 is the first layer, while the bottom surface (back) of the multi-layer circuit board 1 is the eighth layer. Each of FIGS. 5 to 12 illustrates the configuration on each layer viewed from the top surface of the multi-layer circuit board 1 (on which the MMIC is mounted), while FIG. 13 illustrates the configuration on the eighth layer viewed from the back of the multi-layer circuit board 1 (FIGS. 10 to 12 illustrate the fifth to seventh layers 15–17, respectively, through the fourth to sixth insulating layers 14–16. This applies to FIGS. 15 to 22 associated with a second embodiment, later described).

Each of the insulating layers 11–17 can be made only of a resin material, or of a composite material including an extra inorganic material added to a resin material. For example, the insulating layers 11–17 can be made of a composite material including a polyvinyl benzyl ether compound and a ceramic dielectric powder.

Other than the polyvinyl benzyl ether compound, the insulating layers 11–17 can be made of a thermosetting resin, for example, epoxy resin, phenol resin, unsaturated polyester resin, vinylester resin, polyimide resin, cyanate resin, polybutadiene, and the like.

On the other hand, the additive material mixed with the resin material can be a dielectric material, for example, $BaO—TiO_2—Nd_2O_3$ based, $BaO—TiO_2—SnO_2$ based, $BaO—TiO_2—Sm_2O_3$ based, $PbO—BaO—Nd_2O_3—TiO_2$ based, $BaTiO_3$ based, $PbTiO_3$ based, $SrTiO_3$ based, $CaTiO_3$ based, $(Ba,Sr)TiO_3$ based, $Ba(Ti,Zr)O_3$ based, $BaTiO_3—SiO_2$ based, $SrZrO_3$ based, $BiTiO_4$ based, $(Bi_2O_3,PbO)—BaO—TiO_2$ based, $La_2Ti_2O_7$ based, $Nd_2TiO_7$ based, $(Li,Sm)TiO_3$ based, $MgTiO_3$ based, $Mg_2O_4$ based, $Al_2O_3$ based, $TiO_2$ based, $BaO—SiO_2$ based, $PbO—CaO$ based, $BaWO_4$ based, $CaWO_4$ based, $Ba(Mg,Nb)O_3$ based, $Ba(Mg,Ta)O_3$ based, $BA(Co,Mg,Nb)O_3$ based, $Ba(Co,Mg,Ta)O_3$ based, $Sr(Mg,Nb)O_3$ based, $Ba(Zn,Ta)O_3$ based, $Ba(Zn,Nb)O_3$ based, $Sr(Zn,Nb)O_3$ based, $Ba(Mg,W)O_4$ based, $Ba(Ga,Ta)O_3$ based, $ZnTiO_3$ based, $ZrTiO_3$ based, $(Zr,Sn)TiO_4$ based, and the like. The addition of any of these materials to the resin material can increase the capacitance of capacitors formed within the circuit board.

Additionally, an oxide such as Mn—Zn based ferrite, Ni—Zn based ferrite, Mn—Mg—Zn based ferrite, Ni—Cu—Zn based ferrite, Ba based ferrite, and the like, and a magnetic material such as iron oxide such as $Fe_2O_3$, $Fe_3O_4$, and the like can be added to the resin material.

One or a mixture of two or more of these additive materials (the aforementioned dielectric materials and magnetic materials) may be added to the resin material.

The MMIC 2 is a semiconductor circuit component including the semiconductor circuit Q1, which comprises semiconductor devices in a three-stage configuration, in the circuit diagram illustrated in FIG. 3. The MMIC 2 is encapsulated with a sealing resin for ensuring the reliability. The MMIC 2 has its electrodes connected to a conductor pattern (not shown) formed on the multi-layer circuit board 1 by wire bonding or the like for mounting on the top surface of the multi-layer circuit board 1.

A plurality of the thermal vias 4 are formed within an area in which the MMIC 2 is mounted at proper intervals, such that they continuously extend through the first to seventh insulating layers 11–17. The thermal vias 4 are filled with a conductive paste, for example, an Ag paste or the like, but may be filled with a non-conductive material as long as it excels in thermal conductivity.

The first to seventh insulating layers 11–17 are mounted with chip components except for the semiconductor devices included in the MMIC 2 from among circuit components included in the circuit diagram of FIG. 3, and the chip components are connected to form part of the necessary circuit configuration. Though there is no particular limitations in the layout of the circuit components, an example which can be employed will be described later with reference to FIGS. 6 to 13.

In the power amplifier module according to this embodiment, as illustrated in FIG. 4, an inductor conductor segment (conductor line having an inductor function) 21 comprises a conductor pattern 22 formed on the first layer 11 of the multi-layer circuit board 1; a conductor pattern 23 formed on the second layer 12; a thick conductor 24 (hereinafter called the "post via") extending through the first insulating layer 11 to electrically connect the conductors 22, 23, formed on the first and second layers, to each other. The conductor pattern 22 formed on the first layer and the conductor pattern 23 formed on the second layer, as well as the post via 24 for connecting both conductor patterns 22, 23 formed on the first and second layers have the same flat shape, and these conductors 22–24 are integrated into the inductor elements L2–L4 in FIG. 3. A specific method of forming the inductor conductor segment 21 will be described later in detail.

Figure 5:
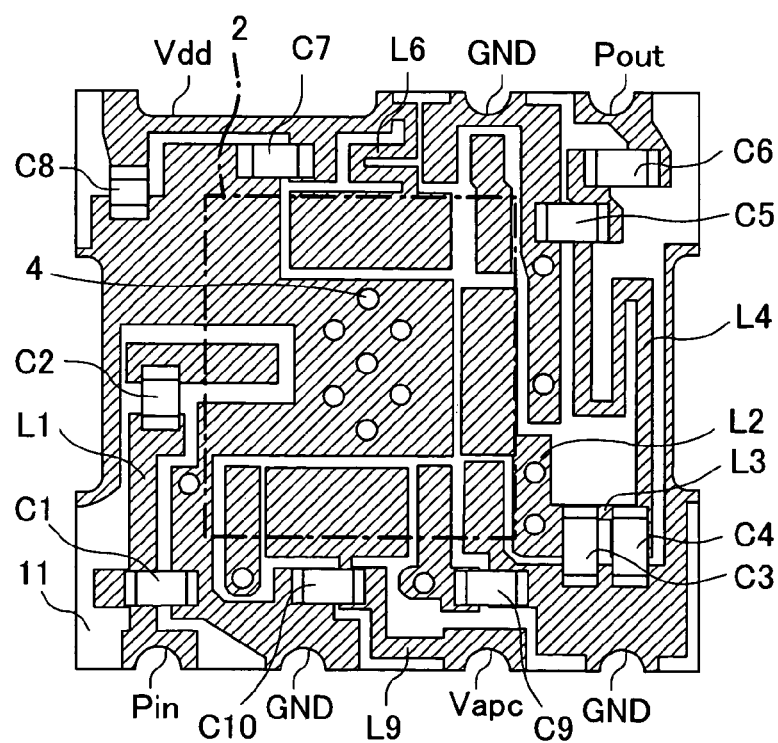
FIG. 5 is a top plan view illustrating the power amplifier module according to the first embodiment.

FIG. 5 is a top plan view of the power amplifier module, and FIGS. 6 to 13 are plan views illustrating the first to eighth layers, respectively. Referring to these figures, the first layer (surface (top surface) of the first insulating layer 11) is mounted with some of circuit elements which make up the bias circuit BC1 in FIG. 3, and circuit elements which make up the impedance matching circuits IM1, OM1. Specifically, components formed on the first layer are capacitor elements C1, C2, C5–C10, a conductor pattern, and the like.

Figure 6:
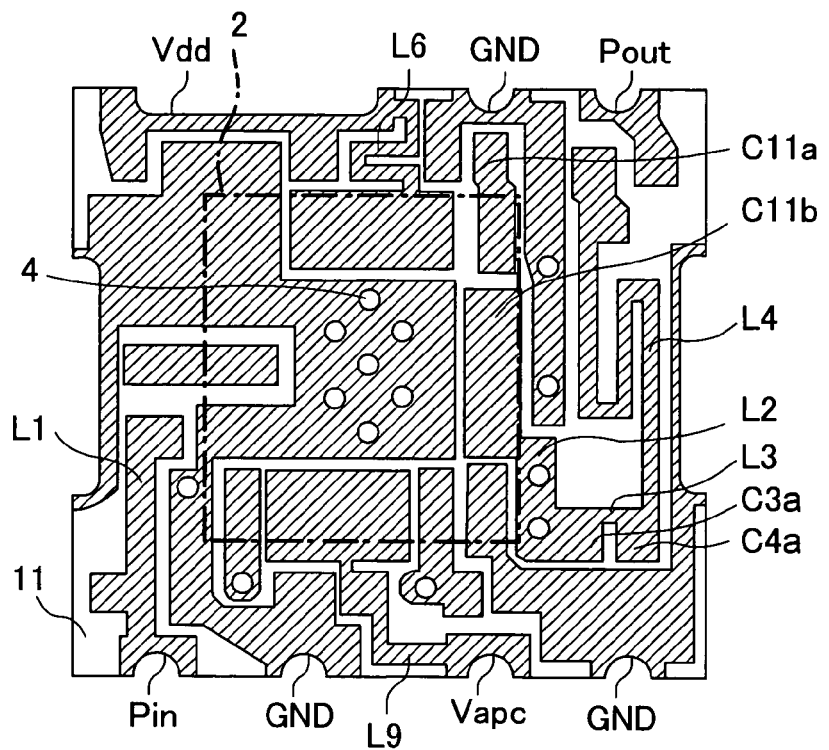
FIGS. 6 to 13 are plan views illustrating a first to an eighth layer in a multi-layer circuit board used in the power amplifier module according to the first embodiment (FIGS. 6–12: taken from the top surface of the circuit board/FIG. 13: taken from the bottom surface of the circuit board), respectively.
Figure 7:
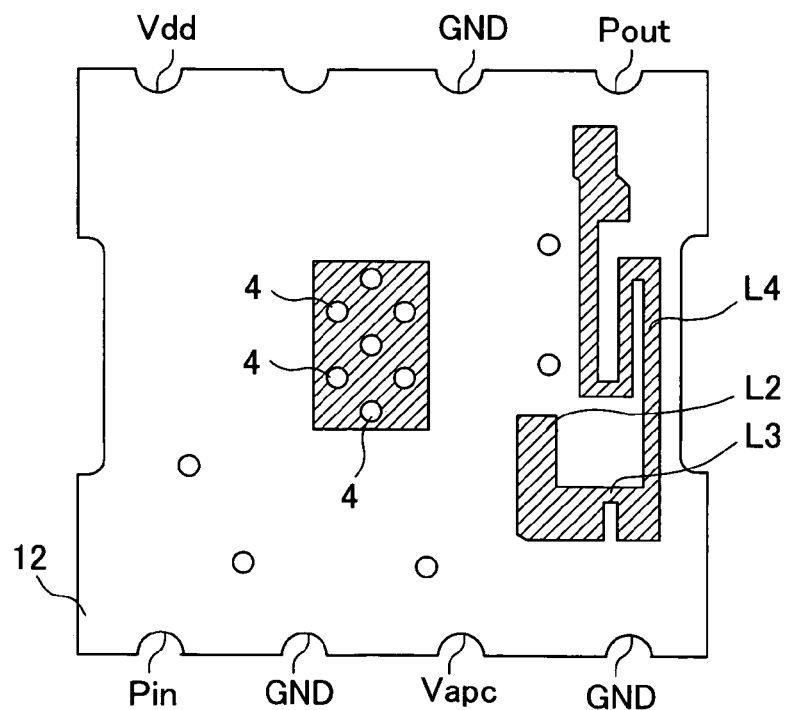
Figure 8:
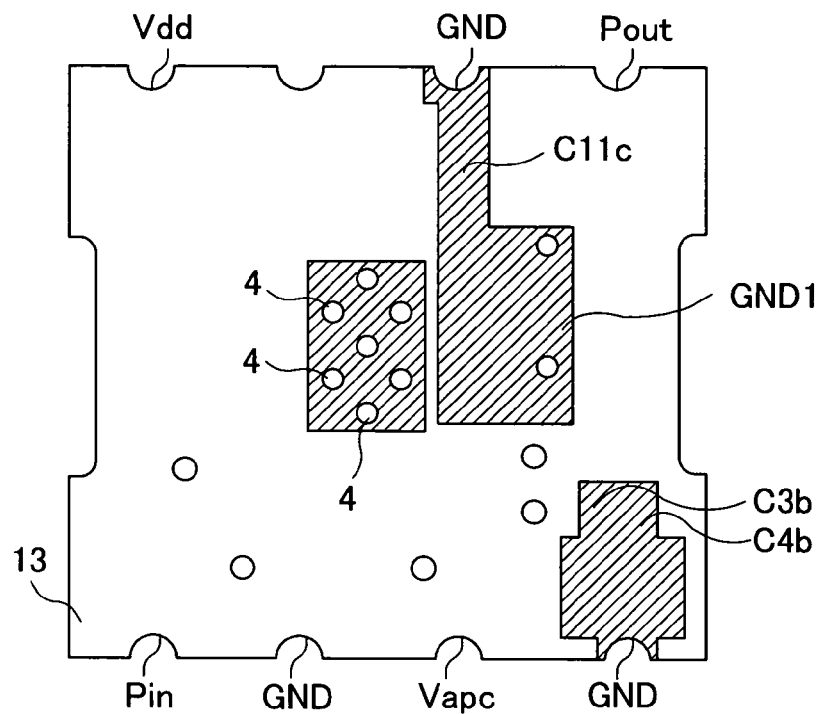
Figure 9:
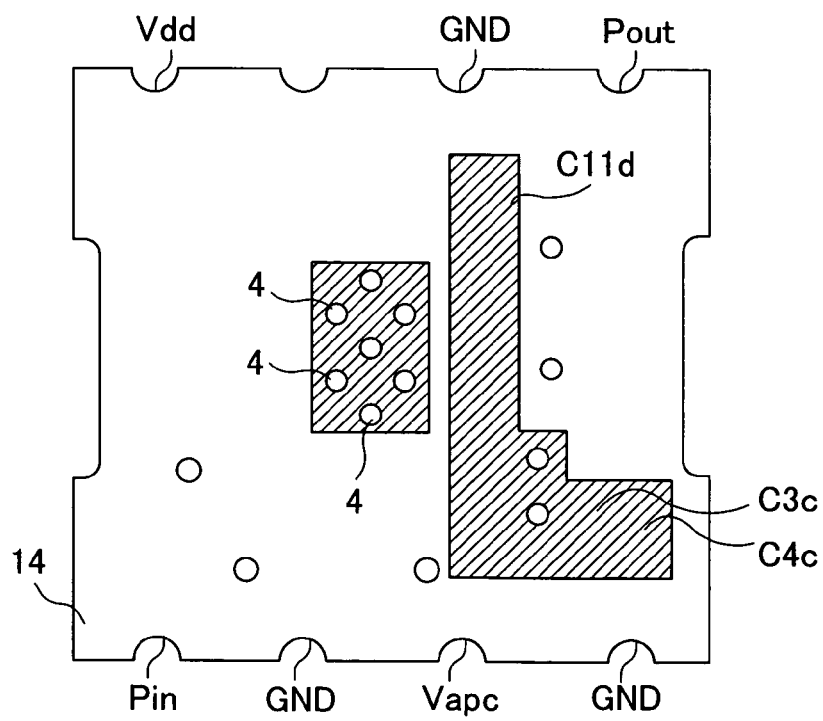

Among these circuit components, the capacitors C1, C2, C5–C10 are implemented by chip parts which are attached to a conductor pattern previously formed on the first layer by such a means as soldering. The inductor elements L1–L4, L6, L9 can be implemented by strip lines formed on the first layer (FIG. 6). Further, the first layer is formed with electrodes C11a, C11b for forming the capacitor element C11, and electrodes C3a, C4a for forming the capacitor elements C3, C4.

The second layer (FIG. 7) is formed with the inductor elements L2–L4. A conductor pattern which makes up these inductor elements L2–L4 are integrated with the conductor pattern formed on the first layer for the inductor elements L2–L4 through the post via which has the same shape as the conductor pattern, when seen in a plan view, as previously mentioned.

The third layer (FIG. 8) is formed with an electrode C11c, electrodes C3b, C4b, and a ground pattern GND1. The electrode C11c and electrodes C3b, C4b oppose the electrodes C11a, C11b and electrodes C3a, C4a formed on the first layer, respectively, to form the capacitor element C11 and capacitor elements C3, C4. Also, the electrode C11c and electrodes C3b, C4b are each connected to the ground terminal GND.

The fourth layer (FIG. 9) is formed with an electrode C11d and electrode C3c, C4c. These electrodes C11d, C3c, C4c oppose the electrodes C11c, and electrodes C3b, C4b, respectively.

The fifth layer (FIG. 10) is formed with a ground pattern GND2. The ground pattern GND2 includes electrodes C11e, C3d, C4d which oppose the electrode C11d and electrodes C3c, C4c, respectively.

As appreciated, the electrodes C11a, C11b oppose the electrode C11c, the electrode C11c opposes the electrode C11d, and the electrode C11d opposes the electrode C11e to form the capacitor element C11 (see FIG. 3). Likewise, the electrode C3a opposes the electrode C3b, the electrode C3b opposes the electrode C3c, and the electrode C3c opposes the electrode C3d to form the capacitor element C3. Further, the electrode C4a opposes the electrode C4b, the electrode C4b opposes the electrode C4c, and the electrode C4c opposes the electrode C4d, to form the capacitor element C4.

The sixth layer (FIG. 11) does not have a circuit conductor pattern which forms part of the power amplifier module, while the seventh layer (FIG. 12) is formed with strip lines for implementing the inductor elements L5, L7, L8 within the bias circuit BC1 (see FIG. 3). Then, the eighth layer (FIG. 13), which is the bottom surface of the multi-layer circuit board 1, is formed with a ground pattern GND3 such that it covers the majority of the eighth layer. The multi-layer circuit board 1 is further provided with a signal input terminal Pin, a signal output terminal Pout, a ground terminal GND, a first to a fifth power supply terminal Vgg, Vdd, and the like in the form of side electrodes.

[Second Embodiment]

Figure 14:
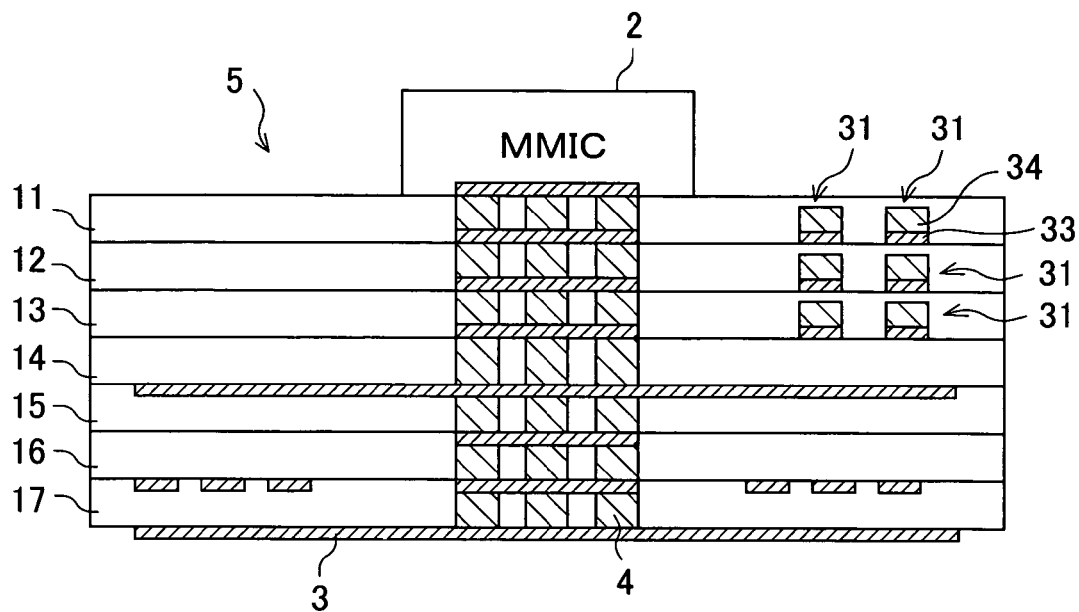
FIG. 14 is a cross-sectional view illustrating a power amplifier module according to a second embodiment of the present invention.
Figure 15:
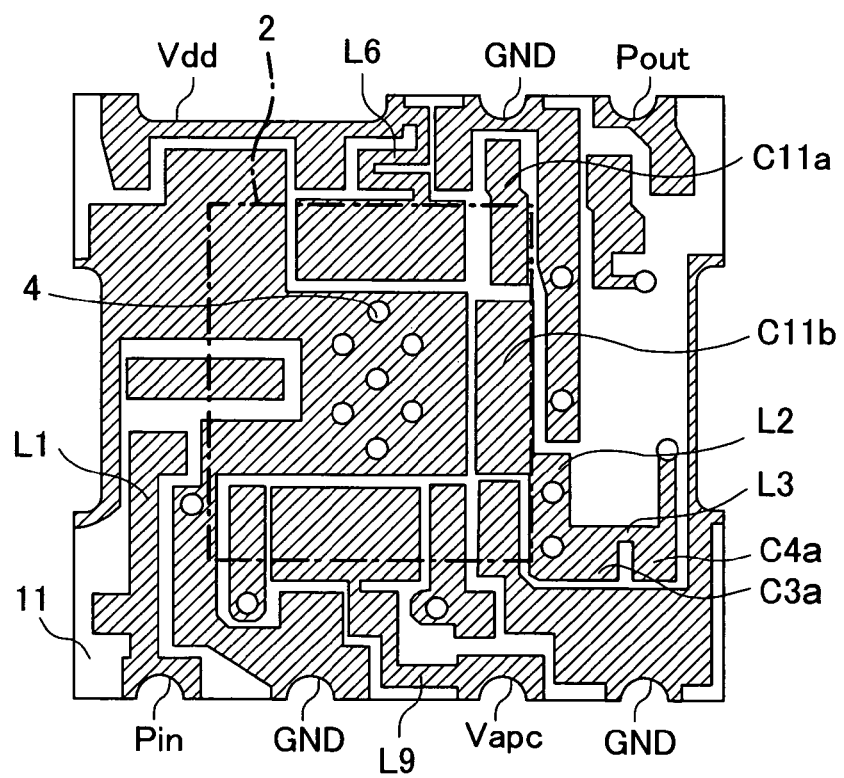
FIGS. 15 to 22 are plan views illustrating a first to an eighth layer of a multi-layer circuit board used in the power amplifier module according to the second embodiment (FIGS. 15–21: taken from the top surface of the circuit board/FIG. 22: taken from the bottom surface of the circuit board), respectively.

FIG. 14 illustrates a power amplifier module according to a second embodiment of the present invention. FIGS. 15 to 22 illustrate the configuration of the multi-layer circuit board, which comprises the power amplifier module according to the second embodiment, as is the case with FIGS. 6 to 13. In these figures, parts identical or corresponding to those in the first embodiment are designated the same reference numerals, and repeated description is omitted, so that the following description will focus only on particular aspects of the second embodiment.

While in the first embodiment, the inductor element L4 of the output matching circuit OM1 is formed in a meander pattern, the power amplifier according to the second embodiment has the inductor element L4 formed of a conductor which has a helical pattern.

Figure 16:
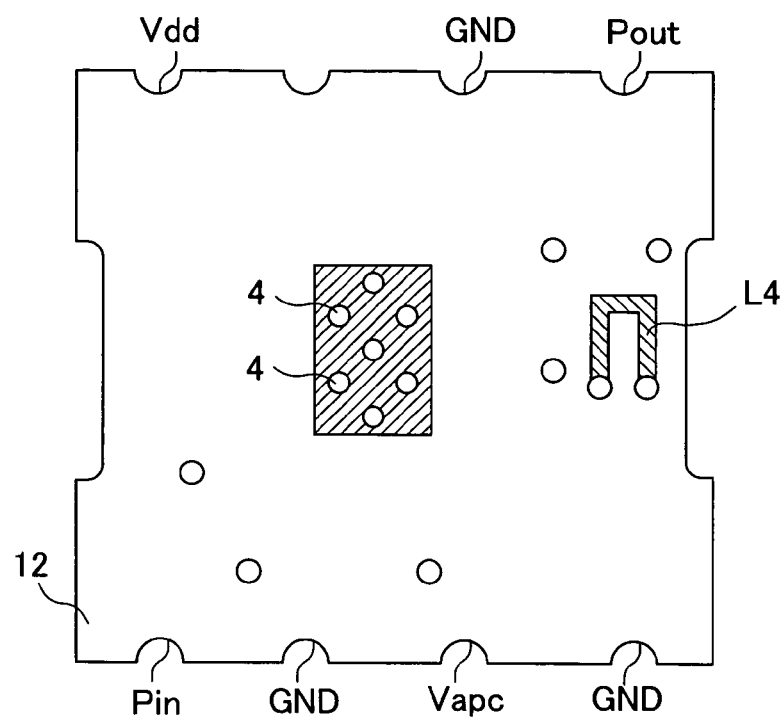
Figure 17:
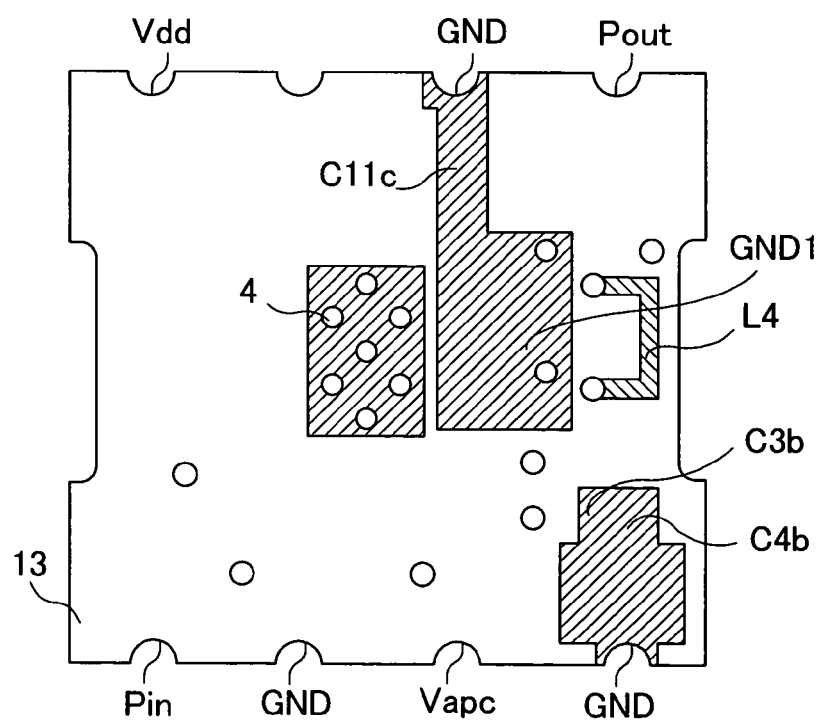
Figure 18:
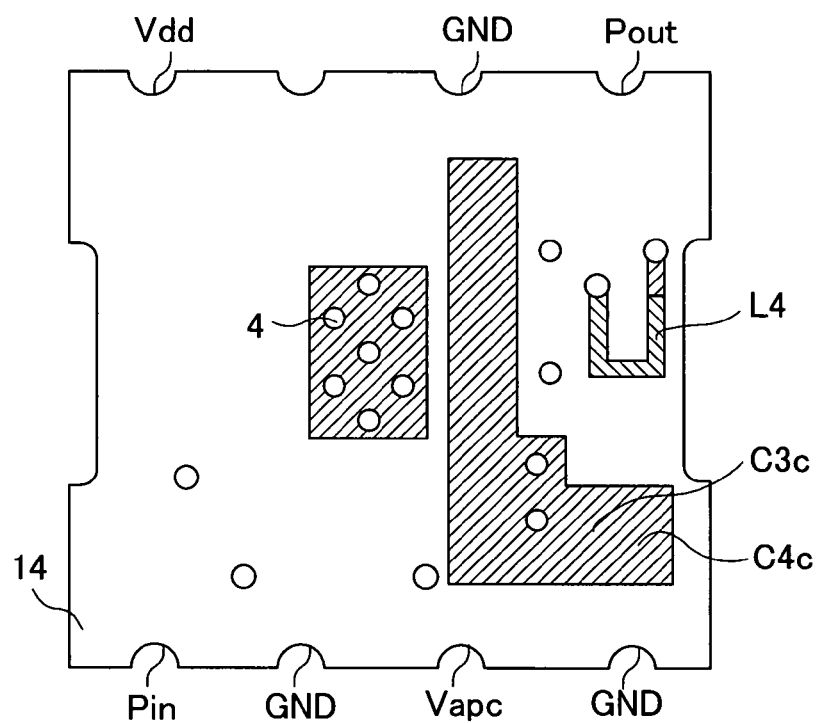
Figure 19:
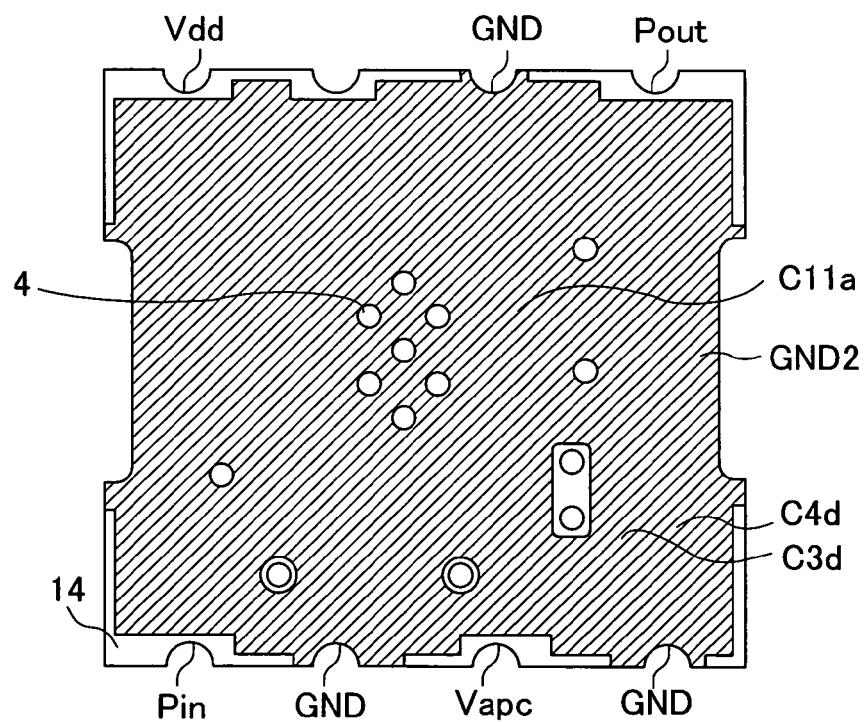
Figure 20:
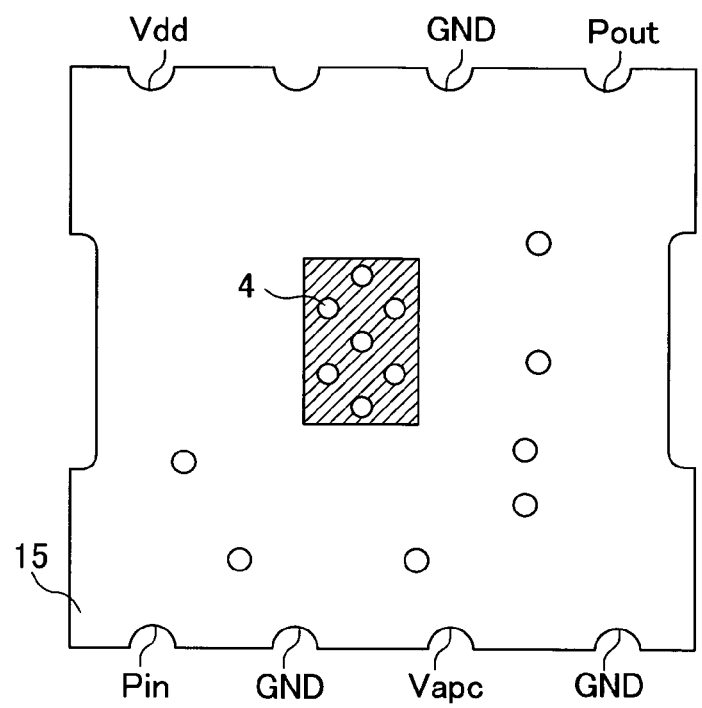
Figure 21:
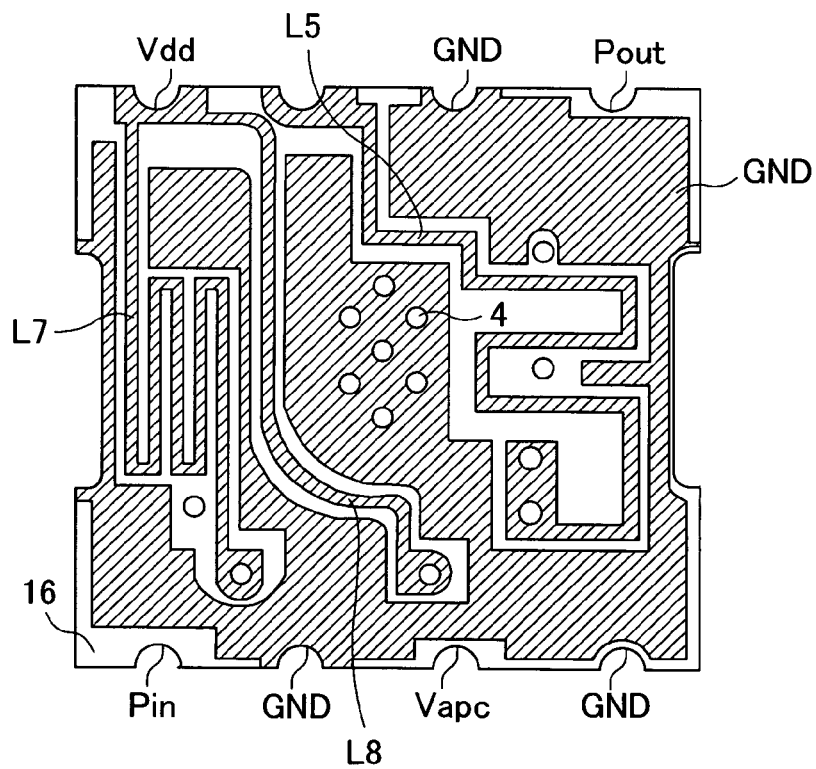
Figure 22:
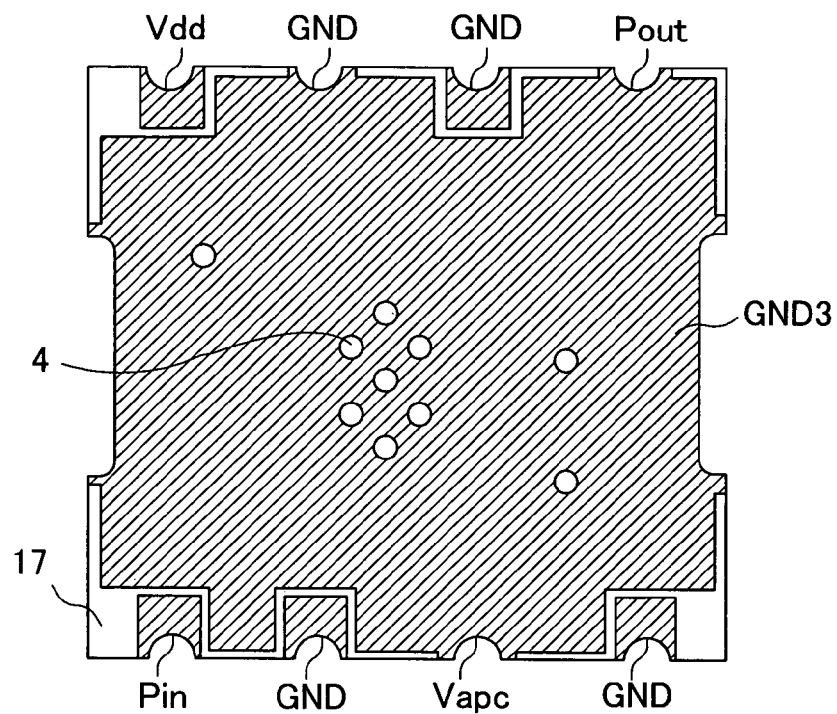

Specifically, as illustrated in FIGS. 16 to 18, for forming a helical conductor pattern across the second to fourth layers, these layers are each formed with a conductor pattern which is substantially in a U-shape, when taken in a plan view, and the conductor patterns in the respective layers are connected to one another through via holes to form the inductor element L4.

Here, in the second embodiment, a conductor pattern 31 for the inductor element L4 formed in each of the second to fourth layers are made to have a larger thickness than other conductor patterns within the circuit board by forming a post via 34 having the same shape as the conductor pattern 33, when seen in a plan view, on the conductor pattern 33 formed on each of the second to fourth layers, and is arranged to be embedded into adjacent (overlying) insulating layers 11–13, as illustrated in FIG. 14. This is because the resistance of the conductor is reduced to accomplish a smaller loss in the inductor element L4, as is the case with the first embodiment.

Such an inductor conductor segment (conductor patterns and post via), is preferably as thick as possible from a viewpoint of reducing a loss, and desirably has the thickness at least one-half as much as the thickness of the insulating layers. Also, stating in relation to other conductors formed in the multi-layer substrate, the inductor conductor segment (conductor patterns and post via) preferably has a thickness 1.5 times as much as the thickness of other conductors.

Specifically, the inductor conductor segments 21, 31 can have a thickness of 42 μm, for example, in the module of the second embodiment, and, 64 μm, for example, in the module of the first embodiment. With this specific thickness of the inductor conductor segments, the thickness of the insulating layer (the distance between conductor patterns of the upper and lower layers, i.e., the distance between the conductor pattern on the top surface of the lower layer and the conductor pattern on the bottom surface of the upper layer) is 40 μm, and the thickness of the remaining conductor patterns with the substrate is 12 μm in either of the embodiments.

When the inductor elements L2–L4 are designed to have the thickness as described above, the loss of the first output matching circuit OM1 can be improved by 9.1 dB, with the result that the efficiency of the power amplifier module can be improved by 1%. Thus, according to the second embodiment, the resulting power amplifier module can provide a high efficiency as compared with the prior art.

[Third Embodiment]

Figure 23:
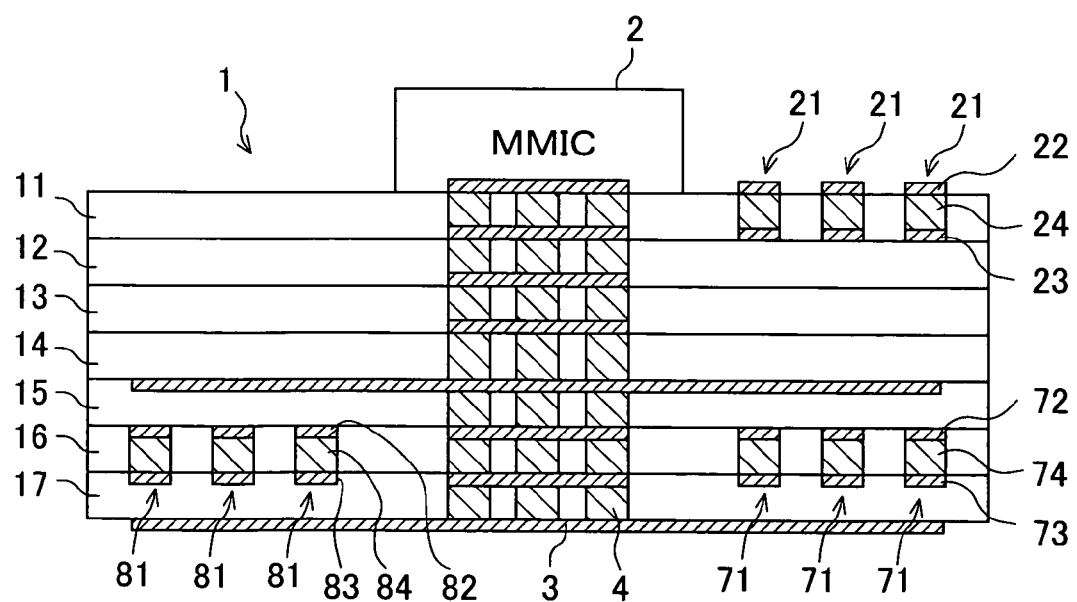
FIG. 23 is cross-sectional view illustrating a power amplifier module according to a third embodiment of the present invention.
Figure 24:
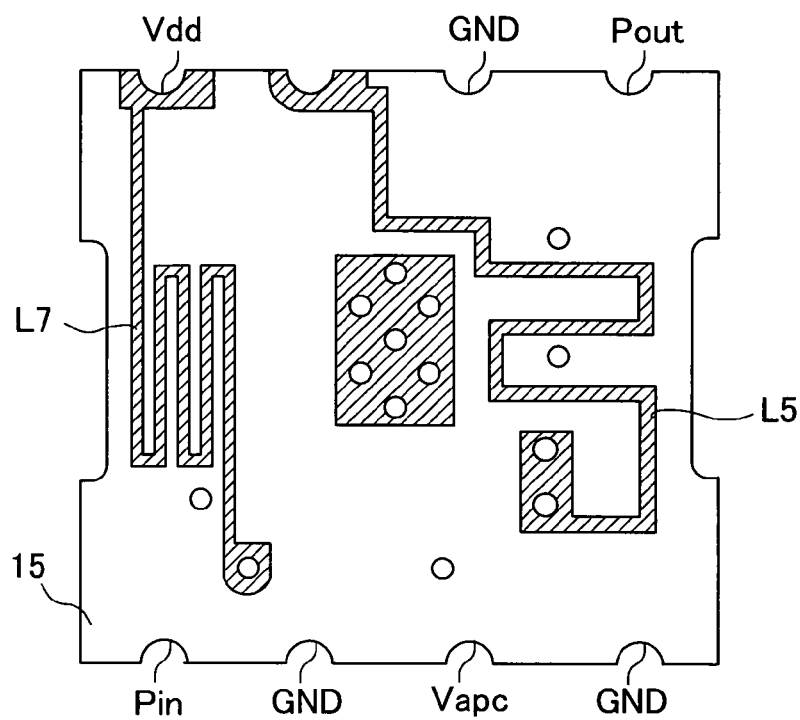
FIGS. 24 and 25 are plan views illustrating a sixth and a seventh layer of a multi-layer circuit board used in the power amplifier module according to the third embodiment (taken from the top surface of the circuit board), respectively.
Figure 25:
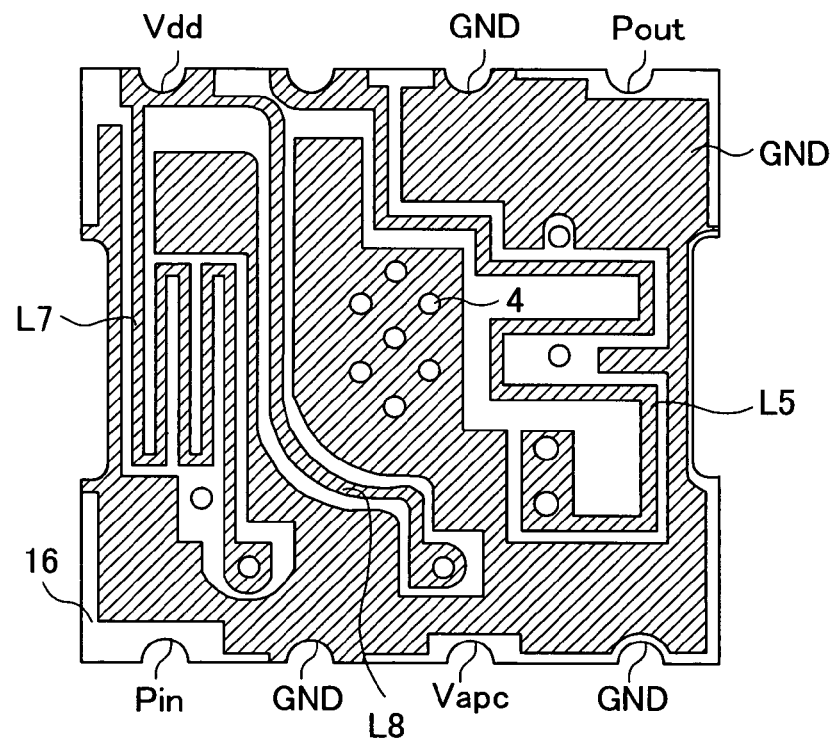

FIG. 23 illustrates a power amplifier module according to a third embodiment of the present invention, and FIGS. 24 and 25 illustrate a sixth layer and a seventh layer, respectively, of a multi-layer circuit board which comprises the power amplifier module according to the third embodiment, in a manner similar to the aforementioned FIGS. 11 and 12. In these figures, parts identical or corresponding to those of the first embodiment are designated the same reference numerals, and repeated description is omitted, so that the following description will focus only on particular aspects of the third embodiment.

As illustrated in FIG. 23, in the power amplifier module according to the third embodiment, inductor elements L5 and L7 included in the bias circuit BC1 shown in FIG. 3 are formed of inductor conductor segments 71, 81, respectively, which extend through the insulating layer similar to the inductor conductor segment 21 in the first embodiment.

Specifically, the power amplifier module according to the third embodiment comprises the inductor conductor segment (conductor line having an inductor function) 71 which is made up of a conductor pattern 72 formed on the sixth layer of the multi-layer circuit board 1, a conductor pattern 73 formed on the seventh layer, and a thick conductor 74 (post via) extending through the sixth insulating layer 16 for electrically connecting the conductors 72, 73, formed on the sixth and seventh layers, to each other.

Similarly, the power amplifier module according to the third embodiment comprises the inductor conductor segment 81 which is made up of a conductor pattern 82 formed on the sixth layer of the multi-layer circuit board 1, a conductor pattern 83 formed on the seventh layer, and a thick conductor 84 (post via) extending through the sixth insulating layer 16 for electrically connecting the conductors 82, 83, formed on the sixth and seventh layers, to each other.

The conductor patterns 72, 82 formed on the sixth layer, the conductor patterns 73, 83 formed on the seventh layer, and the post vias 74, 84 for connecting both conductor patterns formed on the sixth and seventh layers have the same shape, when seen in a plan view, and these conductors 72–74 and 82–84 are integrated to form the inductor elements L5 and L7 in FIG. 3.

FIG. 24, which illustrates the sixth layer, and FIG. 25, which illustrates the seventh layer. The line patterns of the inductor elements L5 and L7 appear in these figures. A specific method of forming the inductor conductor segments 71, 81 are similar to the method of forming the inductor conductor segment 21 in the first embodiment, and will be described later.

According to the third embodiment, the resistance of the inductor conductor segments can be reduced to accomplish smaller losses in the inductor elements L5, L7, as is the case with the first embodiment. Particularly, when the semiconductor circuit Q1 is supplied with a DC current, the DC current flows through the inductor elements L5, L7. The inductor elements L5, L7 have a length of λ/4 to prevent a high frequency signal from leaking to the Vdd terminal and the like, and the inductor elements L5, L7 will present a DC resistance in a range of several tens to one hundred and several tens of mΩ, so that the inductor elements L5, L7 will produce large losses when a DC current flows therethrough. Therefore, the benefit of reducing these losses is significant.

More specifically, the DC resistance $r$ is given by:

$$r = \rho \cdot l / w / t,$$

where l is a line length which forms an inductor element, w is a line width, t is a thickness of the line, and ρ is a specific resistance.

On the other hand, the inductor conductor segments 71, 81 (inductor elements L5, L7) can have a thickness of 64 μm, for example, similar to the inductor conductor segment 21 in the first embodiment. Assuming that the inductor elements L5, L7 have a thickness of such a value based on the third embodiment, the line thickness t of the inductor can be increased approximately five times (conventionally, 12 μm), so that the resistance of the line can be reduced approximately by a factor of five.

The efficiency of the power amplifier module can be improved by 2% by a reduction in the loss in the bias circuit BC1, and the efficiency can be improved by a total of 3% by combining the inductor conductor segments 71, 81 with the inductor conductor segment 21 in the first embodiment, as in the third embodiment.

As described above, the power amplifier module according to the third embodiment can improve the efficiency as compared with before. It should be noted that in the present invention, only the inductor elements L5, L7 in the bias circuit BC1 can be made thicker as in the third embodiment (the inductor elements L2–L4 in the output matching circuit OM1 have a similar thickness as before), and such a power amplifier module is also included in the scope of the present invention.

Further, the inductor elements L5, L7 may be formed of conductor patterns (which are embedded without extending through the insulating layer) having a thickness similar to the inductor conductor segment 31 shown in FIG. 14 (second embodiment). Specifically, a post via (thicker conductor) having the same shape as the conductor pattern 72 formed on the sixth layer, when seen in a plan view, is formed on the conductor pattern 72 to increase the thickness of the conductor pattern 72.

According to the foregoing configuration, since different conductor pattern and elements can be formed on a layer (the seventh layer in this embodiment) laminated on a layer (the sixth layer in this embodiment) which has been formed with the inductor element, it is possible to improve the degree of freedom in designing, and effectively utilize adjacent wiring layers to mount elements thereon at a higher density. It should be noted that the inductor elements L5, L7 can be formed on a layer other than the foregoing (this applies to other elements as well), and are not limited to the formation on the layer shown in the embodiment.

[Method of Forming Inductor Conductor Segment]

The inductor conductor segment (post via), which characterizes the present invention, can be formed, for example, by the following method.

Figure 26A:
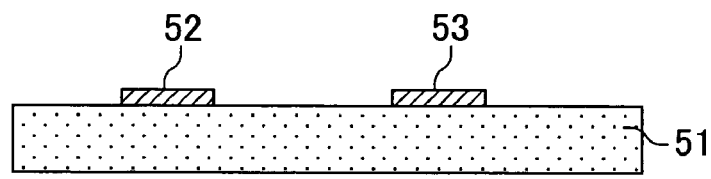
FIGS. 26A to 26H are cross-sectional views of a circuit board showing in order a process of forming an inductor conductor segment (post via) in the embodiments of the present invention.
Figure 26B:
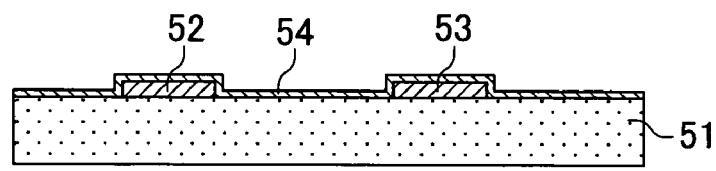
Figure 26C:
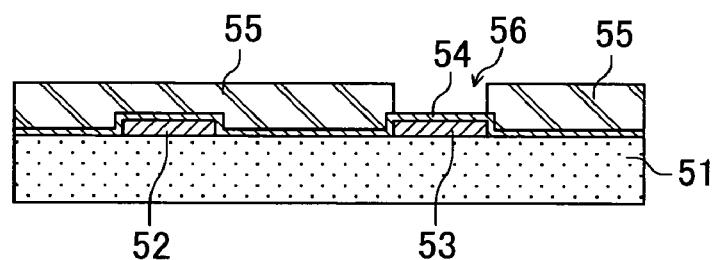
Figure 26D:
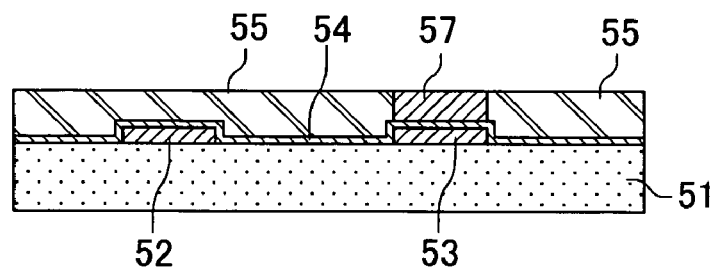
Figure 26E:
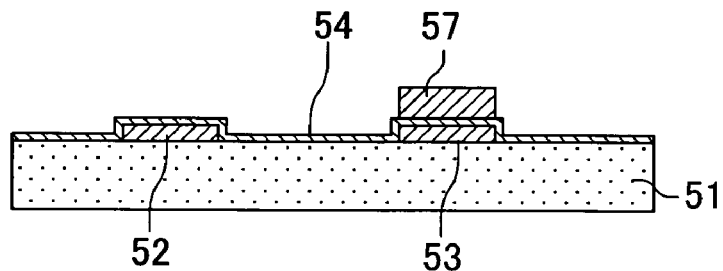
Figure 26F:
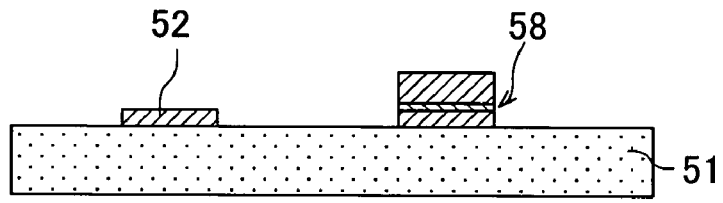

First, conductor patterns 52, 53 are formed on the surface of an insulating layer 51 (see FIG. 26A), and a thin conductive layer 54 is formed over the whole surface of the insulating layer 51 by electroless plating (see FIG. 26B). Then, a plating resist 55 is applied or bonded on the conductive layer 54, covered with a mask, and exposed and developed to remove the plating resist from a portion 56 on which a post via is to be formed (see FIG. 26C). Subsequently, a conductive metal is deposited on the conductor pattern 53 for forming an inductor element by electrolytic plating to grow a post via 57 upward (see FIG. 26D). After forming the post via 57 to a predetermined thickness, the plating resist 55 is peeled off (see FIG. 26E), and the conductive layer 54 is removed by etching (see FIG. 26F). In this way, a conductor pattern 58 can be formed with a large thickness.

Figure 26G:
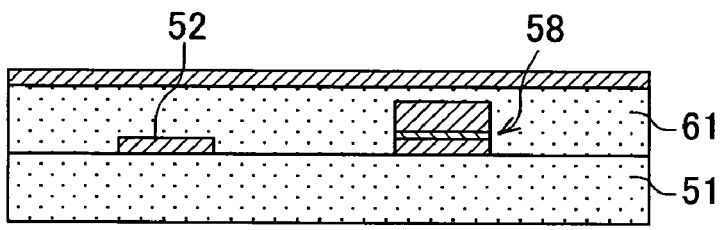
Figure 26H:
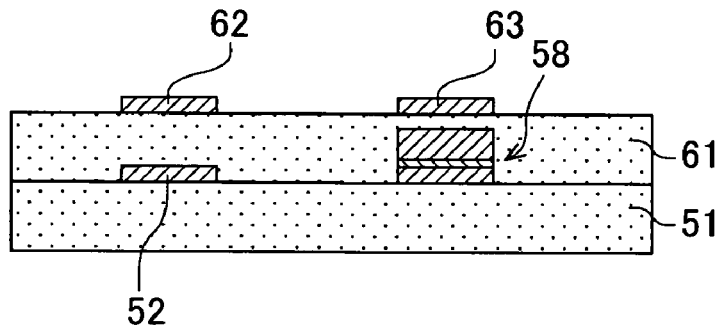

Then, a resin is coated or a resin-coated copper foil is bonded to laminate an insulating layer 61 (see FIG. 26G), and the top surface of the insulating layer 61 is polished for planarization, followed by formation of overlying conductor patterns 62, 63 (see FIG. 26H). Further, the foregoing steps (FIGS. 26B to 26H) can be repeated to form the inductor conductor segment 31 in the second embodiment (FIG. 14).

Figure 27A:
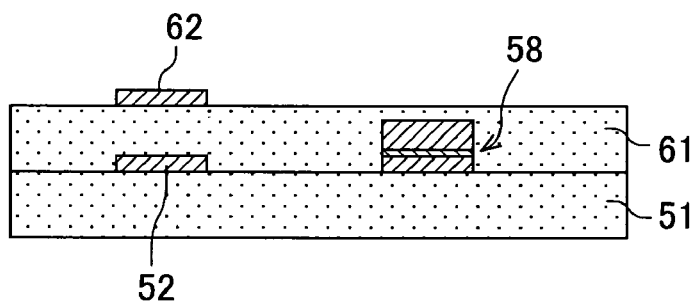
FIGS. 27A to 27D are cross-sectional views of a circuit board showing in order a process of forming the inductor conductor segment (post via) in the embodiments of the present invention.
Figure 27B:
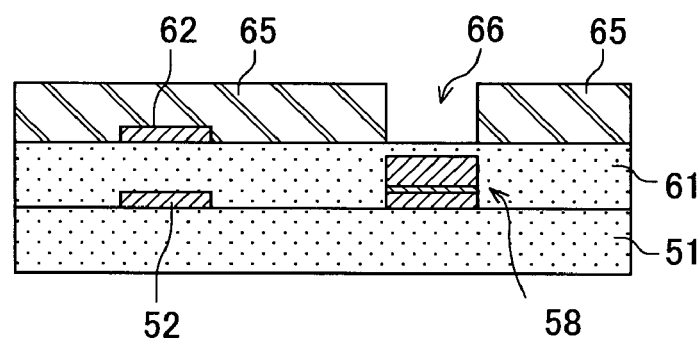
Figure 27C:
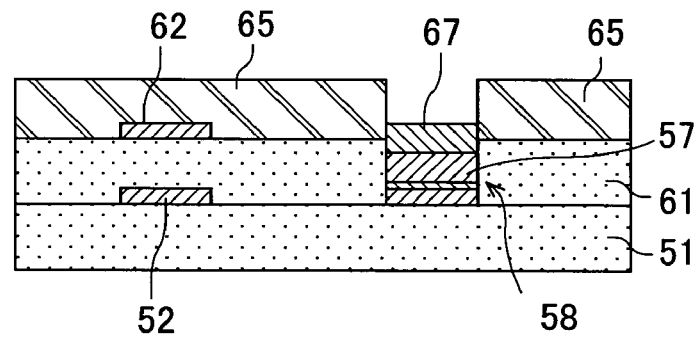
Figure 27D:
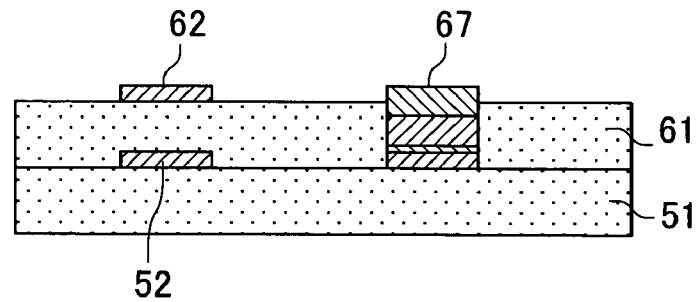

On the other hand, in regard to the inductor conductor segments in the first and third embodiments, as illustrated in FIGS. 27A to 27D, after the other overlying conductor pattern 62 have been formed in FIG. 26G (see FIG. 27A), a resist 65 is applied or bonded, and removed from a portion 66 in which a post via should be formed through exposure and developing steps (see FIG. 27B). Then, the insulating layer 61 is removed, for example, by sandblasting or the like to expose the post via 57 (see FIG. 27C). The metal is further grown from the post via 57 by plating until it extends beyond the insulating layer 61 (see FIG. 27D). In this way, the inductor conductor segment 21, 71, or 81, which extends through the insulating layer 61, can be formed in accordance with the first and third embodiments (FIGS. 4 and 23).

While several embodiments of the present invention have been described with reference to the accompanying drawings, it should be apparent to those skilled in the art that the present invention is not limited to such embodiments but can be modified in various manners without departing from the spirit and scope of the invention as set forth in the appended claims.

For example, the inductor conductor segment is formed to extend through the first insulating layer (over the fist and second layers) in the first embodiment, and formed through the second to the fourth layers in the second embodiment. Alternatively, the inductor conductor segment can be formed in layers other than the foregoing. Also, the inductor conductor segment can be formed in another shape, for example, a sigmoidal shape, instead of a meander pattern and a helical pattern. The number of layers laminated in the multi-layer circuit board, the respective wiring patterns, and the positions at which components are mounted can be modified in various manners in addition to the examples shown in the figures, as previously stated. Further, while the inductor element containing circuit board and power amplifier module of the present invention are suitable for use in an RF section of a mobile telephone, they are not limited to such applications but can be applied to electronic devices having a variety of communication functions such as PHS, PDA having communication capabilities, a wireless LAN card, and the like.

What is claimed is:

1. A power amplifier modules comprising:
   a semiconductor amplifier;
   a bias circuit connected to said semiconductor amplifier; and
   a multi-layer circuit board containing an inductor element including:
      a plurality of conductive layers; and
      a conductor having an inductor function formed in at least one of said plurality of conductive layers, wherein
   said conductor having an inductor function has a larger thickness in at least part thereof than conductors formed on an insulating layer within said multi-layer circuit board, and said bias circuit has a portion thereof formed of said conductor having an inductor function.

2. The power amplifier module of claim 1, wherein at least part of said conductor has an inductor function extending through an insulating layer disposed between said conductive layers.

3. The power amplifier module of claim 1, wherein at least part of said conductor has an inductor function embedded in an insulating layer disposed between said conductive layers, and has a thickness one-half or more the thickness of said insulating layer to an extent that said at least part of said conductor having an inductor function does not extend through said insulating layer.

4. The power amplifier module of claim 1, wherein at least part of said conductor has an inductor function embedded in an insulating layer disposed between said conductive layers, and has a thickness 1.5 times or more larger than other conductors not having an inductor function.

5. A power amplifier modules comprising:
    a semiconductor amplifier;
    an impedance matching circuit coupled to an output of said semiconductor amplifier;
    a bias circuit connected to said semiconductor amplifier; and
    a multi-layer circuit board containing an inductor element including:
        a plurality of conductive layers; and
        a conductor having an inductor function formed in at least one of said plurality of conductive layers, wherein
    said conductor having an inductor function has a larger thickness in at least part thereof than conductors formed on an insulating layer within said multi-layer circuit board, and
    said impedance matching circuit and said bias circuit having a portion thereof formed of said conductor having an inductor function.

6. The power amplifier module of claim 5, wherein at least part of said conductor having an inductor function extends through an insulating layer disposed between said conductive layers.

7. The power amplifier module of claim 5, wherein at least part of said conductor having an inductor function is embedded in an insulating layer disposed between said conductive layers, and has a thickness one-half or more the thickness of said insulating layer to an extent that said at least part of said conductor having an inductor function does not extend through said insulating layer.

8. The power amplifier module of claim 5, wherein at least part of said conductor has an inductor function embedded in an insulating layer disposed between said conductive layers, and has a thickness 1.5 times or more larger than other conductors not having an inductor function.

* * * * *

UNITED STATES PATENT AND TRADEMARK OFFICE
CERTIFICATE OF CORRECTION

| | | |
|---|---|---|
| PATENT NO. | : 7,176,756 B2 | Page 1 of 1 |
| APPLICATION NO. | : 11/010327 | |
| DATED | : February 13, 2007 | |
| INVENTOR(S) | : Toshiyuki Abe et al. | |

It is certified that error appears in the above-identified patent and that said Letters Patent is hereby corrected as shown below:

Column 12, line 53, change " modules" to --module--.

Column 13, line 2, change "conductor having" to --conductor and having--.

Column 13, line 19, change "modules" to --module--.

Signed and Sealed this

Twelfth Day of June, 2007

JON W. DUDAS
*Director of the United States Patent and Trademark Office*